United States Patent
Lee et al.

(10) Patent No.: US 6,930,919 B2
(45) Date of Patent: Aug. 16, 2005

(54) NAND-TYPE FLASH MEMORY DEVICE HAVING ARRAY OF STATUS CELLS FOR STORING BLOCK ERASE/PROGRAM INFORMATION

(75) Inventors: Jin-Yub Lee, Seoul (KR); Dong-Kyu Youn, Gyeonggi-do (KR); Min-Gun Park, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/788,738

(22) Filed: Feb. 26, 2004

(65) Prior Publication Data

US 2004/0165442 A1 Aug. 26, 2004

(30) Foreign Application Priority Data

Feb. 26, 2003 (KR) .............................. 10-2003-0012066

(51) Int. Cl.[7] .............................................. G11C 16/04
(52) U.S. Cl. ............................ 365/185.17; 365/198.01
(58) Field of Search ...................... 365/185.17, 189.01, 365/218, 185.29, 185.33

(56) References Cited

U.S. PATENT DOCUMENTS

| | | | |
|---|---|---|---|
| 5,844,843 A | * 12/1998 | Matsubara et al. | .... 365/185.24 |
| 6,061,270 A | 5/2000 | Choi | |
| 6,335,881 B2 | 1/2002 | Kim et al. | |
| 6,735,116 B2 | * 5/2004 | Lee et al. | .............. 365/185.17 |
| 2004/0042272 A1 | * 3/2004 | Kurata | .................. 365/185.33 |

* cited by examiner

Primary Examiner—Thong Q. Le
(74) Attorney, Agent, or Firm—Marger Johnson & McCollom, P.C.

(57) ABSTRACT

A NAND-type flash memory device including a memory cell array having a plurality of memory blocks is provided. An example NAND-type flash memory device includes a status cell array which has a plurality of status cells and stores data indicating erase/program statuses of the memory blocks, a data generation circuit which generates data indicating a program status of a selected memory block in response to a data input command and generates data indicating an erase status of a selected memory block in response to a block erase setup command, a first signal generation circuit which generates a block status write enable signal and a clock signal in response to either one of an erase command and a program command, a selection circuit which selects at least one of the status cells of the status cell array in response to a block address of the selected memory block, a write circuit which receives data from the data generation circuit in response to the clock signal during a program or erase operation and writes the received data in the selected status cell, and a control circuit which operates in response to a block status write enable signal from the first signal generation circuit and controls the write circuit so as to the store the data inputted to the write circuit in a selected status cell when an erase/program operation for the selected memory block is carried out.

17 Claims, 5 Drawing Sheets

നAND-TYPE FLASH MEMORY DEVICE
HAVING ARRAY OF STATUS CELLS FOR
STORING BLOCK ERASE/PROGRAM
INFORMATION

RELATED APPLICATION

This application claims priority from Korean Patent Application No. 2003-12066, filed on Feb. 26, 2003, the contents of which are incorporated herein by reference in their entirety.

FIELD OF THE INVENTION

The present invention relates to a semiconductor memory device and, more particularly, to a NAND-type flash memory device.

BACKGROUND OF THE INVENTION

Non-volatile memory devices such as flash memory devices are well known in the art. In a typical NAND-type flash memory device, a memory cell array for storing data includes a number of memory blocks each having memory cells in a number of pages. Memory cells of the respective blocks are erased at the same time. The NAND-type flash memory device stores high-capacity data while requiring considerable program time.

A NAND flash memory device and a program method thereof are disclosed in U.S. Pat. No. 6,061,270 entitled "METHOD FOR PROGRAMMING A NON-VOLATILE MEMROY DEVICE WITH PROGRAM DISTURB CONTROL" and U.S. Pat. No. 6,335,881 entitled "NAND-TYPE FLASH MEMORY DEVICE AND METHOD OF OPERATING THE SAME".

To program data in any memory block of a NAND-type flash memory device, an external control unit (e.g., a memory controller, a microcontroller, etc.) checks the erase or program status of a selected memory block before a program operation. If the selected memory block is in an erase state, the data is programmed in the selected memory block by a conventional method. On the other hand, if the selected memory block is in a program state, the data is not programmed in the selected memory block.

As is well known in the art, a NAND-type flash memory device requires considerably long read time, which leads to increase of entire program time (or operation speed) of the NAND-type flash memory device. Here the entire program time means the sum of time required for checking the erase/program status of a memory block and time required for practically programming data. As a result, the operation speed of a system including the NAND-type flash memory device may be reduced.

SUMMARY OF THE INVENTION

Embodiments of the invention provide a NAND-type flash memory device that stores block status information. Such embodiments also enable a NAND-type flash memory device to have a shorter program time than conventional devices.

DESCRIPTION OF THE PREFERRED EMBODIMENT

A NAND-type flash memory device according to embodiments of the present invention can provide data, which indicates an erase/program status of a memory block selected at a high speed before the data is programmed in the selected memory block, to the outside within a shorter time than a reading time of the NAND-type flash memory. When the selected memory block is erased, data indicating an erase status of the selected memory block is stored in a status cell that is independent of the memory block. When the selected memory block is programmed, data indicating a program status of the selected memory block is stored in a status cell that is independent of the memory block. This will be explained in detail later.

A NAND-type flash memory device according to embodiments of the present invention will now be described with reference to FIG. 1.

Figure 1:
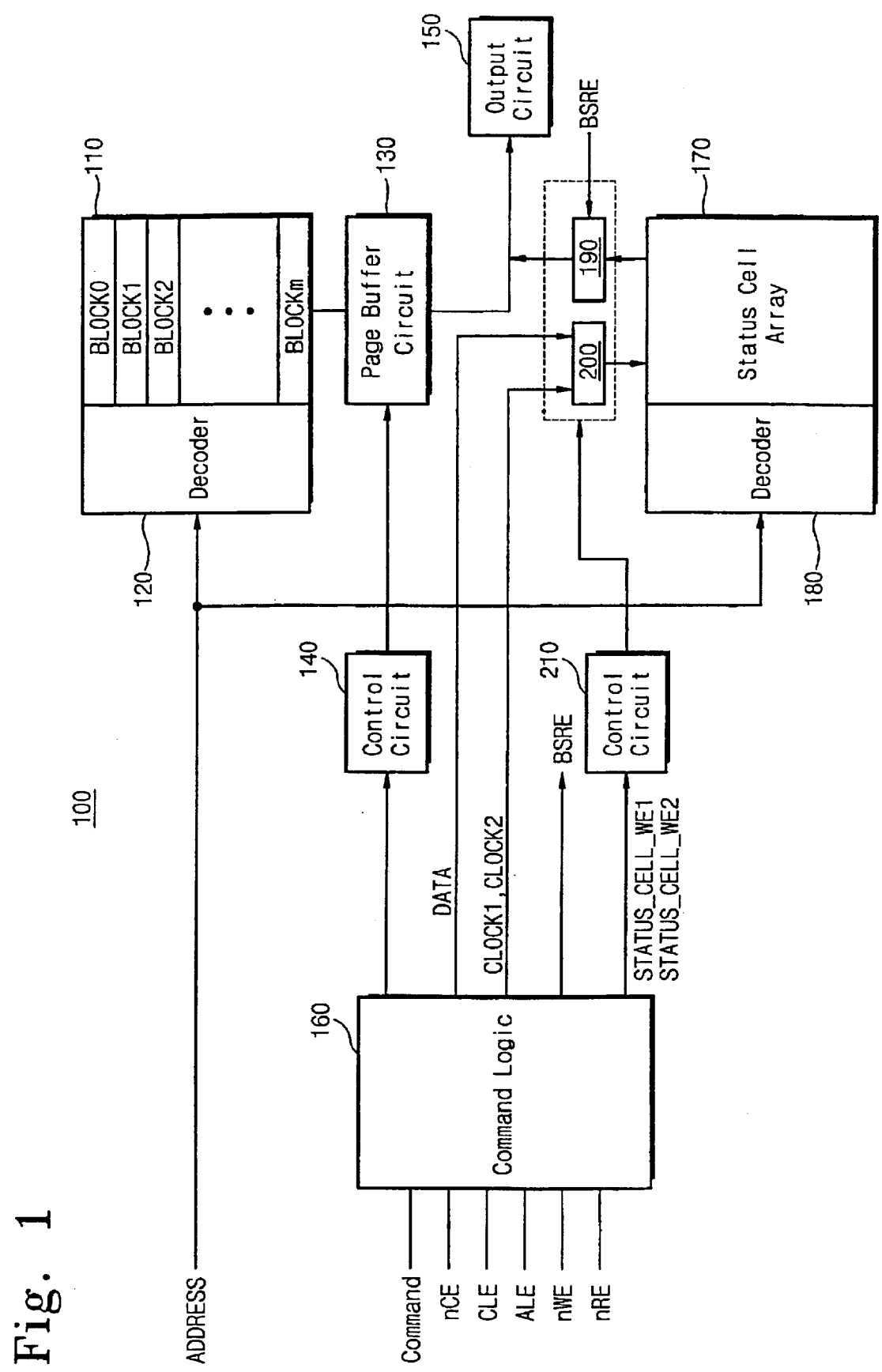
FIG. 1 is a block diagram of a NAND-type flash memory device according to embodiments of the present invention.

Referring to FIG. 1, a flash memory device 100 includes a memory cell array 110 having a number of memory blocks BLOCK0–BLOCKm. Each of the memory blocks BLOCK0–BLOCKm includes a number of pages (or wordlines) each having a number of memory cells. Memory cells of each column constitute a NAND string. A decoder circuit 120 selects a memory block and its page in response to an externally provided address. A page buffer circuit 130 is controlled by a control circuit 140 and reads data from memory cells of a selected page of a memory block selected during a read operation. The read-out data is outputted to the outside through an output circuit 150. The page buffer circuit 130 temporarily stores the data inputted through the output circuit 150 during a program operation. Depending on the control of the control circuit 140, loaded data is programmed in memory cells of a page selected through the page buffer circuit 130. A command logic circuit 160 receives a command and control signals nCE, CLE, ALE, new, and nRE from the outside. According to the input command, the control circuit 140 controls the operation of the page buffer circuit 130.

The NAND-type flash memory device 100 further includes a status cell array 170 that stores data indicating an erase/program status for the memory blocks BLOCK0–BLOCKm of the memory cell array 110. The status cell array 170 includes a plurality of non-volatile status cells having overwritable memory cells. The status cells include memory cells having a reading time shorter than the time required for reading data from a selected memory block.

As shown in FIG. 1, the NAND-type flash memory device 100 further includes a decoder circuit 180, a read circuit 190, a write circuit 200, and a control circuit 210.

The decoder circuit 180 selects at least one of the status cells of the status cell array 170 in response to a block address for selecting a memory block. The read circuit 190 operates in response to a block status read enable signal BSRE from the command logic circuit 160 and reads data from a selected status cell. The read-out data is data indicating an erase/program status of a memory block corresponding to a block address. The data from the read circuit 190 is outputted to the outside through the output circuit 150. The write circuit 200 receives clock signals CLOCK1 and CLOCK2 and data from the command logic circuit 160. For example, when the selected memory block is erased, the write circuit 200 receives the data (indicating an erase status of the selected memory block) from the command logic in response to the activation of the clock signal CLOCK1. When the selected memory block is programmed, the write circuit 200 receives the data (indicating a program status of the selected memory block) from the command logic circuit 160 in response to the activation of the clock signal CLOCK2. The control circuit 210 controls the operation of the write circuit 200 in response to block status write enable signals STATUS_CELL_WE1 and STATUS_CELL_WE2 from the command logic circuit 160.

In some embodiments of the invention, when the selected memory block of the memory cell array 110 is erased, erase status information of the selected memory block, which is generated from the command logic circuit 160, is stored in the status cell array 170. Similarly, when the selected memory block of the memory cell array 110 is programmed, program status information of the selected memory block, which is generated from the command logic circuit 160, is stored in the status cell array 170. In the event that data is programmed in any memory block, the erase/program status information of a memory block is read from the status cell array 170. The program operation of the memory block is determined based on the read-out result. For example, if a memory block corresponding to a currently inputted block address is in an erase status, a program operation for the memory block is to be carried out. If a memory block corresponding to a currently inputted block address is in a program status, a block status read operation for another memory block is to be carried out.

The command logic circuit 160, shown in FIG. 1, will now be described in more detail with reference to FIG. 2.

To perform a block erase operation, a 60H command, an address, a D0H command, and a 70H command are inputted to the NAND-type flash memory device 100 depending upon a determined timing. The 60H command denotes a block erase setup command, and the D0H command denotes an erase command. Further, the 70H command denotes a read status command. To perform a program operation, an 80H command, address and data, a 10H command, and a 70H command are inputted to the NAND-type flash memory device depending upon a pre-determined timing. The 80H command denotes a sequential data input command, and the 10H command denotes a program command. To perform a block status read operation, a 71H command and an address are inputted to the NAND-type flash memory device 100 depending upon a predetermined timing. The 71H denotes a block status read command, and the address denotes a block address for assigning a memory block to be programmed.

Figure 2:
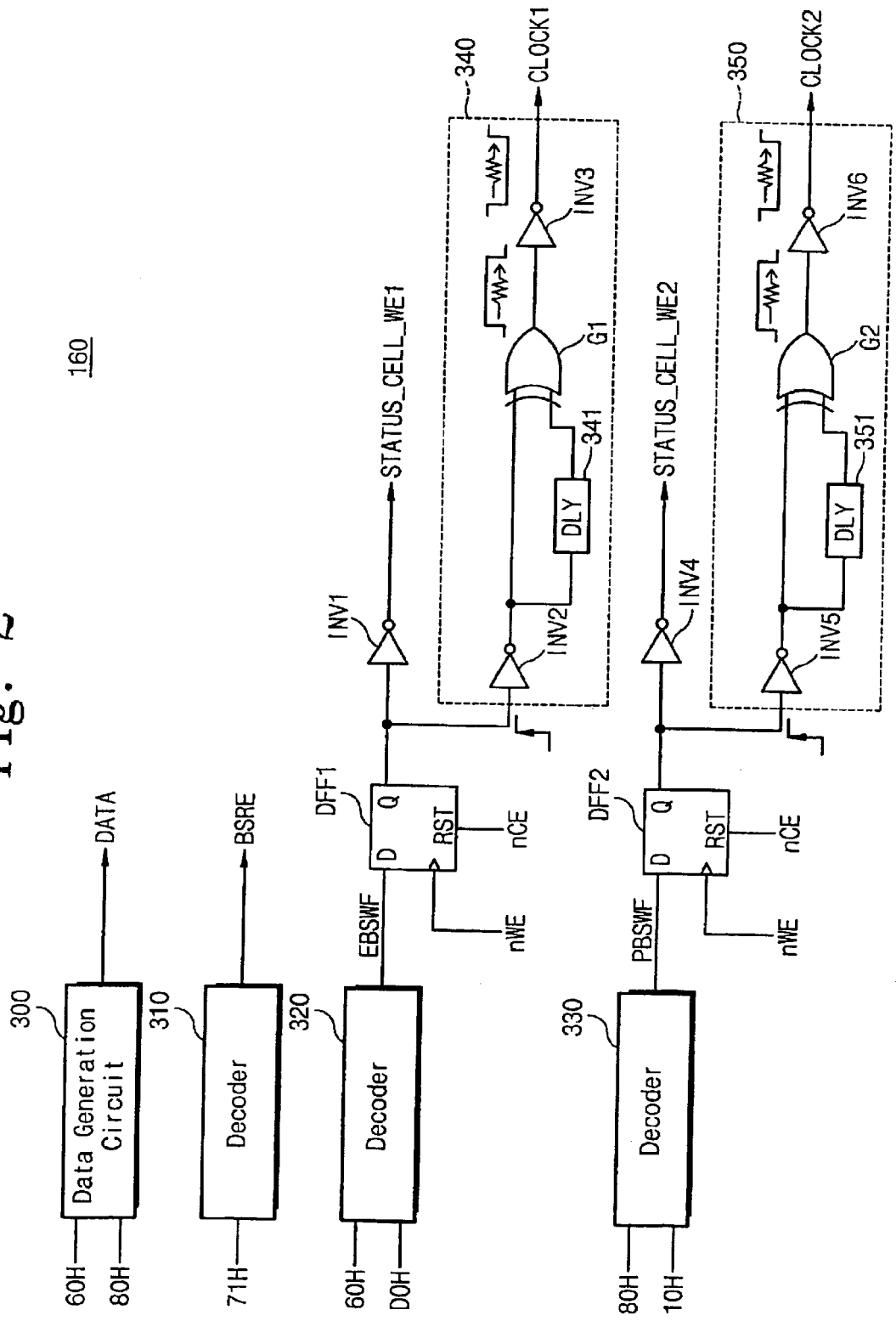
FIG. 2 is a block diagram of a command logic, shown in FIG. 1, according to embodiments of the present invention.

Referring to FIG. 2, an example command logic circuit 160 includes a data generation circuit 300, first, second, and third decoders 310, 320, and 330, D flip-flops DFF1 and DFF2, inverters INV1 and INV2, and pulse generators 340 and 350.

The data generation circuit 300 generates data of "1" in response to the input of the block erase setup command 60H and generates data of "0" in response to the input of the sequential data input command 80H. The data of "1" means that a memory block to be programmed is in an erase status, and the data of "0" means that a memory block to be programmed is in a program status. The first decoder 310 generates a block status read enable signal BSRE in response to the block status read command 71H.

The second decoder 320 generates a block status write flag signal EBSWF in response to the block erase setup command 60H and an erase command D0H. For example, when the erase command D0H is inputted after inputting the block erase setup command 60H, the second decoder 320 activates a block status write flag signal EBSWF. The D flip-flop DFF1 latches the output signal EBSWF of the second decoder 320 in synchronization with a rising edge of an NEW signal that is a clock signal. The D flip-flop DFF1 is reset in a low-to-high transition of an nCE signal that is a reset signal. An output signal FERASE of the D flip-flop DFF1 is outputted as a block status write enable signal STATUS_CELL_WE1 through an inverter INV1. The pulse generator 340 has inverters INV2 and INV3, a delayer (DLY) 341, and an exclusive OR gate G1, which are connected as shown in this figure. The pulse generator 340 generates a clock signal CLOCK1 of an active low pulse in response to a low-to-high transition of the output signal FERASE of the D flip-flop DFF1.

The third decoder 330 generates a block status write flag signal PBSWF in response to a sequential data input command 80H and a program command 10H. For example, when the program command 10H is inputted after inputting the sequential data input command, the third decoder 330 activates a block status write flag signal PBSWF. The D flip-flop DFF2 latches the output signal PBSWF of the third decoder in synchronization with a rising edge of an nWE signal that is a clock signal. The D flip-flop DFF2 is reset in a low-to-high transition of an nCE signal that is a reset signal. An output signal FPROGRAM of the D flip-flop DFF2 is outputted as a block status write enable signal STATUS_CELL_WE2 through an inverter INV4. The pulse generator 350 has inverters INV5 and INV6, a delayer (DLY) 351, and an exclusive OR gate G2, which are connected as shown in this figure. The pulse generator 350 generates a clock signal of an active low pulse in response to a low-to-high transition of the output signal FPROGRAM of the D flip-flop DFF2.

An example erase operation of the NAND-type flash memory device 100 according to embodiments of the present invention will now be described with reference to FIG. 3.

Figure 3:
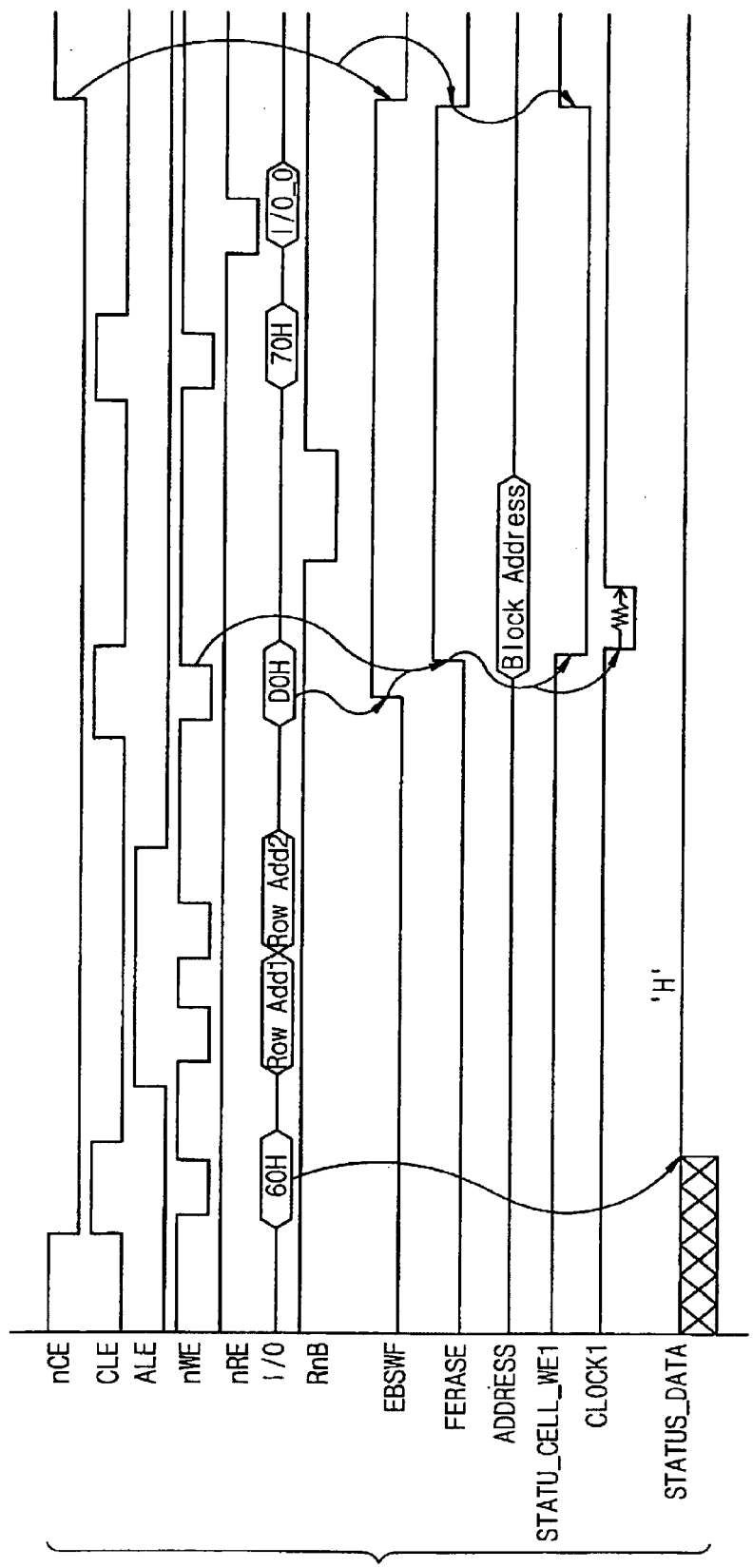
FIG. 3 and FIG. 4 are timing diagrams for explaining a block status write operation of the NAND-type flash memory device according to embodiments of the present invention.

In order to erase any memory block, a 60H command, an address, and a D0H command are inputted depending upon a pre-determined timing, an example of which is shown in FIG. 3. As the 60H command and the D0H command are inputted, the control circuit 140 controls a page buffer circuit 130 and a high-voltage generation circuit (not shown) such that a selected memory block is erased according to the control of the command logic circuit 160. This was already described in the above-mentioned patents and will not be described in further detail.

After an erase operation for the selected memory block is carried out, it is determined whether the selected memory block is correctly erased. This determination is carried out by means of data outputted through an input/output pin I/O0 according to the input of the read status command 70H, which is well known in the art. During erasure of the selected memory block, block status information of the selected memory block is to be written in the status cell array 170 through the following procedure.

A data generation circuit 300 of the command logic circuit 160 generates data of "1" STATUS_DATA indicating the erasure of a selected memory block. According to a block address corresponding to a memory block to be erased, a status cell of the status cell array 170 is selected by the decoder circuit 180. A second decoder 320 of the command logic circuit 160 activates a block status write flag signal EBSWF to a high level in response to the input of the D0H command after the input of the 60H command. The D flip-flop DFF1 latches the output signal EBSWF of the second decoder 320 in response to a low-to-high transition of an nWE signal. The pulse generator 340 generates a clock signal CLOCK1 of an active low pulse in response to a low-to-high transition of the output signal FERASE of the D flip-flop DFF1. The write circuit 200 receives data from the data generation circuit 300 in response to the clock signal CLOCK1. At around the same time, the signal latched to the D flip-flop DFF1 is outputted, as a block status enable signal STATUS_CELL_WE1, through the inverter INV1. The write circuit 200 writes the inputted data in a selected status cell of the status cell array 170 in response to the block status enable signal STATUS_CELL_WE1. When the nCE signal transitions from a low level to a high level, the signals EBSWF, FERASE, STATUS_CELL_WE1 are sequentially deactivated.

An example program operation of the NAND-type flash memory device 100 according to embodiments of the invention will now be described with reference to FIG. 4.

Figure 4:
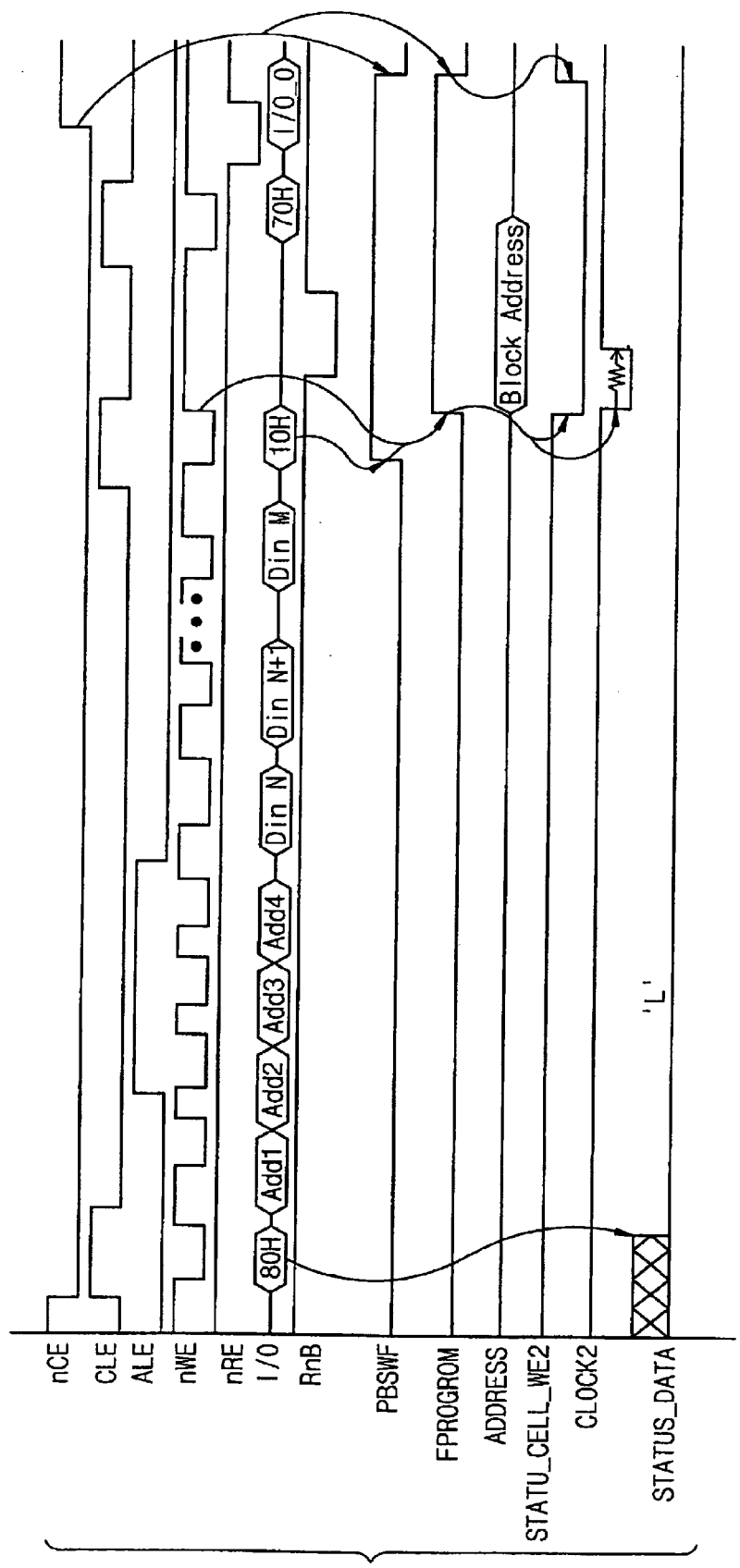

In order to program any memory block, an 80H command, address and data, and a 10H command are inputted to the NAND-flash memory device 100 depending upon a pre-determined timing, an example of which is shown in FIG. 4. As the 80H and 10H commands are inputted, the control circuit 140 controls the page buffer circuit 130 and the high-voltage generation circuit (not shown) such that a selected memory block is programmed. This was already described in the above-mentioned patents and will not be described in further detail.

After a program operation for the selected memory block is carried out, it is determined whether the selected memory block is correctly programmed. This determination is to be conducted by means of data outputted through an input/output pin I/O0 according to the input of the read status command 70H, which is well known in the art. While the selected memory block is programmed, block status information of the selected memory block will be written through the following procedure.

A data generation circuit of a command logic circuit 160 generates data of "0" STATUS_DATA, which indicates that a selected memory block is programmed, in response to the input of an 80H command. According to a block address corresponding to a memory block to be programmed, a status cell of the command logic circuit 160 is selected by a decoder circuit 180. A third decoder 330 of the command logic circuit 160 activates a block status write flag signal PBSWF to a high level in response to the input of a 10H command after inputting an 80H command. A D flip-flop DFF2 latches the output signal PBSWF of the third decoder 330 in response to a low-to-high transition of an nWE signal. A pulse generator 350 generates a clock signal CLOCK2 of an active low pulse in response to a low-to-high transition of an output signal FPROGRAM of the D flip-flop DFF2. The write circuit 200 receives data from a data generation circuit 300 in response to the clock signal CLOCK2. At the same time, the signal latched to the D flip-flop DFF2 is outputted, as a block status write enable signal STATUS_CELL_WE2, through an inverter INV4. The write circuit 200 writes the received data in a selected status cell of the status cell array 170 in response to the block status write enable signal STATUS_CELL_WE2. When an nCE signal transitions from a low level to a high level, the signals PSBWF, FPROGRAM, and STATUS_CELL_WE2 are sequentially deactivated.

Figure 5:
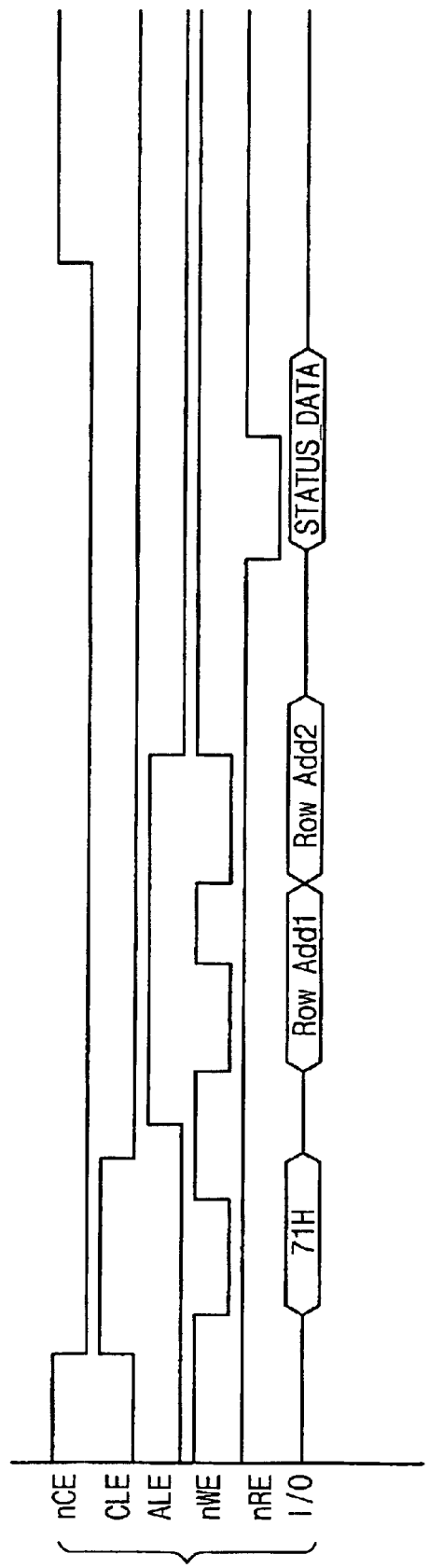
FIG. 5 is a timing diagram for explaining a block status read operation of the NAND-type flash memory device according to embodiments of the present invention.

An example block status read operation of the NAND-type flash memory device 100 will now be described with reference to FIG. 5.

The block status information stored in the status cell array 170 is accessed before programming any memory block. That is, in order to program a memory block, there is typically a need to determine whether the memory block is in an erase status or a program status. For this, a 70 H command is inputted to the NAND-type flash memory device 100. As the 70H command is inputted, a first decoder 310 of the command logic circuit 160 activates a block status read enable signal BSRE in response to the input of a 71H command. Thereafter, the first decoder 310 selects a status cell in response to an externally inputted block address, and the read circuit 190 reads block status information of the selected status cell. An output circuit 150 receives block status data from the read circuit 190 and outputs the block status data to the outside in synchronization with an nRE signal.

When the data outputted from the NAND-type flash memory device 100 indicates that the selected memory block is in an erase state, the selected memory block is not programmed. Instead of the selected memory block, another memory block is to be programmed. In this case, a block status read operation may be performed so as to determine whether another memory block is in an erase state or a program state.

As explained so far, a NAND-type flash memory device according to embodiments of the invention has a special status cell array (or a block status information table) for storing erase/program status information of memory blocks. Therefore, it is possible to perform a program operation at a higher speed.

Some embodiments of the present invention provide a NAND-type flash memory device including a memory cell array having a plurality of memory blocks. The NAND-type flash memory device includes a status cell array which has a plurality of status cells and stores data indicating erase/program statuses of the memory blocks, a data generation circuit which generates data indicating a program status of a selected memory block in response to a data input command and generates data indicating an erase status of a selected memory block in response to a block erase setup command, a first signal generation circuit which generates a block status write enable signal and a clock signal in response to either one of an erase command and a program command, a selection circuit which selects at least one of the status cells of the status cell array in response to a block address of the selected memory block, a write circuit which receives data from the data generation circuit in response to the clock signal during a program or erase operation and writes the received data in the selected status cell, and a control circuit which operates in response to a block status write enable signal from the first signal generation circuit and controls the write circuit so as to store the data inputted to the write circuit in a selected status cell when an erase/program operation for the selected memory block is carried out.

The status cells are overwritable non-volatile memory cells. The first signal generation circuit includes a first signal generator for generating a first block write enable signal and a first clock signal in response to the erase command and a second signal generator for generating a second block status write enable signal and a second clock signal in response to the program command.

The first signal generator includes a decoder for decoding the erase command to generate a block status write flag signal, a latch for latching the block status write flag signal from the decoder in response to a write enable signal, a clock generator for generating the first clock signal in response to an output signal of the latch, and an inverter for inverting the output signal of the latch to output the first block status write enable signal. The second signal generator includes a decoder for decoding the program command to generate a block status write flag signal, a latch for latching the block status write flag signal from the decoder in response to a write enable signal, a clock generator for generating the second clock signal in response to an output signal of the latch, and an inverter for inverting the output signal of the latch to output the second block status write enable signal.

The NAND-type flash memory device further includes a second signal generation circuit which generates a block status read enable signal in response to a block status write command for writing data of the status cells and a read circuit which reads data from a status cell corresponding to a block address to be erased/programmed. The control circuit controls the read circuit in response to the block status read enable signal, and the data read by the read circuit is outputted to the outside through an output circuit.

Having described preferred embodiments of the invention with reference to the accompanying drawings, it is to be understood that the invention is not limited to those precise embodiments, and that various modifications and substitutes may be effected therein by a person skilled in the art without departing from the scope or spirit of the invention as defined in the appended claims.

Of course, particular embodiments of the invention can take many forms. Set forth below are example embodiments that can be used to carry out the invention, however the invention is not limited to only these embodiments.

What is claimed is:

1. A NAND-type flash memory device including a memory cell array having a plurality of memory blocks, comprising:
    a status cell array having a plurality of status cells and structured to store data indicating an erase/program status of the memory blocks;
    a data generation circuit structured to generate data indicating a program status of a selected memory block in response to a data input command and to generate data indicating an erase status of a selected memory block in response to a block erase setup command;
    a first signal generation circuit structured to generate a block status write enable signal and a clock signal in response to either one of an erase command and a program command;
    a selection circuit structured to select at least one of the status cells of the status cell array in response to a block address of the selected memory block;
    a write circuit which is structured to receive data from the data generation circuit in response to the clock signal during a program or erase operation and to write the received data in the selected status cell; and
    a control circuit structured to operate in response to a block status write enable signal from the first signal generation circuit and to control the write circuit to the store the data inputted to the write circuit in a selected status cell when an erase/program operation for the selected memory block is carried out.

2. The NAND-type flash memory device of claim 1, wherein the status cells are overwritable non-volatile memory cells.

3. The NAND-type flash memory device of claim 1, wherein the first signal generation circuit includes:
    a first signal generator for generating a first block write enable signal and a first clock signal in response to the erase command; and
    a second signal generator for generating a second block status write enable signal and a second clock signal in response to the program command.

4. The NAND-type flash memory device of claim 3, wherein the first signal generator includes:
    a decoder for decoding the erase command to generate a block status write flag signal;
    a latch for latching the block status write flag signal from the decoder in response to a write enable signal; and
    a clock generator for generating the first clock signal in response to an output signal of the latch.

5. The NAND-type flash memory device of claim 3, wherein the second signal generator includes:
    a decoder for decoding the program command to generate a block status write flag signal;
    a latch for latching the block status write flag signal from the decoder in response to a write enable signal; and
    a clock generator for generating the second clock signal in response to an output signal of the latch.

6. The NAND-type flash memory device of claim 1, further comprising:
    a second signal generation circuit structured to generate a block status read enable signal in response to a block status write command for writing data of the status cells; and
    a read circuit structured to read data from a status cell corresponding to a block address to be erased/programmed.

7. The NAND-type flash memory device of claim 6, wherein the control circuit is structured to control the read circuit in response to the block status read enable signal, and the data read by the read circuit is outputted to the outside through an output circuit.

8. A NAND-type flash memory device including a memory cell array having a plurality of memory blocks, comprising:
    a status cell array having a plurality of status cells and structured to store data indicating an erase/program status of the memory blocks;
    a write circuit for storing data into the status cell array when a state of one or more of the plurality of memory blocks changes; and
    a read circuit for reading data from the status cell array.

9. The memory device of claim 8 wherein the status cell array can be read faster than one of the memory blocks can be read.

10. The memory device of claim 8, further comprising:
    a data generation circuit structured to generate data indicating a program status of a selected memory block in response to a data input command and to generate data indicating an erase status of a selected memory block in response to a block erase command.

11. The memory device of claim 8, further comprising:
    a first signal generation circuit structured to generate a block status write enable signal and a clock signal in response to either one of an erase command and a program command.

12. The memory device of claim 8, further comprising:
a selection circuit structured to select at least one of the status cells of the status cell array in response to a block address of the selected memory block.

13. A method of operating a memory device, comprising:
receiving a command to program a selected block of memory cells;
reading a cell in a status cell array located within the memory device that indicates a program/erase status of the selected block; and
programming the selected block when the cell in the status array indicates the selected block is in an erased state.

14. The method of claim 13, further comprising:
reading another cell in the status cell array when the cell in the status array indicates the selected block is in a programmed state.

15. The method of claim 13, further comprising:
writing to the status cell array data indicating an erased state after receiving a command to erase a selected block of memory cells.

16. The method of claim 15, wherein writing to the status cell array comprises writing data to overwriteable memory cells.

17. The method of claim 13, wherein reading data from the cell status array is faster than reading data from the selected block of memory cells.

* * * * *